(12) United States Patent
Mouli et al.

(10) Patent No.: US 8,836,030 B2
(45) Date of Patent: Sep. 16, 2014

(54) METHODS OF FORMING MEMORY CELLS, MEMORY CELLS, AND SEMICONDUCTOR DEVICES

(75) Inventors: Chandra V. Mouli, Boise, ID (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 24 days.

(21) Appl. No.: 13/285,638

(22) Filed: Oct. 31, 2011

(65) Prior Publication Data
US 2012/0043611 A1 Feb. 23, 2012

Related U.S. Application Data

(63) Continuation of application No. 12/252,495, filed on Oct. 16, 2008, now Pat. No. 8,067,803.

(51) Int. Cl.
| | | |
|---|---|---|
| H01L 31/04 | (2014.01) | |
| H01L 29/32 | (2006.01) | |
| H01L 29/78 | (2006.01) | |
| H01L 21/265 | (2006.01) | |
| G11C 11/404 | (2006.01) | |
| H01L 29/165 | (2006.01) | |
| B82Y 10/00 | (2011.01) | |
| H01L 27/12 | (2006.01) | |
| H01L 29/66 | (2006.01) | |
| H01L 27/108 | (2006.01) | |

(52) U.S. Cl.
CPC ......... *B82Y 10/00* (2013.01); *G11C 2211/4016* (2013.01); *H01L 29/32* (2013.01); *H01L 29/7841* (2013.01); *H01L 29/785* (2013.01); *H01L 21/26506* (2013.01); *G11C 11/404* (2013.01); *H01L 27/10826* (2013.01); *H01L 29/165* (2013.01); *H01L 27/1211* (2013.01); *H01L 27/10802* (2013.01); *H01L 29/66628* (2013.01)
USPC ............ 257/347; 257/325; 257/321; 365/149

(58) Field of Classification Search
USPC .......................... 257/347, 325, 321; 365/149
See application file for complete search history.

(56) References Cited

U.S. PATENT DOCUMENTS

| 5,359,566 A | 10/1994 | Furuyama |
|---|---|---|
| 5,764,562 A | 6/1998 | Hamamoto |

(Continued)

FOREIGN PATENT DOCUMENTS

KR 1020050071665 5/2005

OTHER PUBLICATIONS

Butt et al., "Scaling Limits of Capacitorless Double Gate DRAM Cell," Purdue University, West Lafayette, IN, SISPAD 2006, pp. 302-305.

(Continued)

*Primary Examiner* — Michael Shingleton
(74) *Attorney, Agent, or Firm* — TraskBritt (57) ABSTRACT

A memory device and method of making the memory device. Memory device may include a storage transistor at a surface of a substrate. The storage transistor comprises a body portion between first and second source/drain regions, wherein the source/drain regions are regions of a first conductivity type. The storage transistor also comprises a gate structure that wraps at least partially around the body portion in at least two spatial planes. A bit line is connected to the first source/drain region and a word line is connected to the gate structure.

9 Claims, 9 Drawing Sheets

(56) References Cited

U.S. PATENT DOCUMENTS

| | | |
|---|---|---|
| 5,768,204 A | 6/1998 | Muraoka |
| 5,917,212 A | 6/1999 | Blake et al. |
| 5,943,571 A | 8/1999 | Schaefer et al. |
| 6,054,349 A | 4/2000 | Nakajima et al. |
| 6,165,842 A | 12/2000 | Shin et al. |
| 6,208,000 B1 | 3/2001 | Tanamoto et al. |
| 6,320,784 B1 | 11/2001 | Muralidhar et al. |
| 6,503,783 B1 | 1/2003 | Mouli |
| 6,638,811 B2 | 10/2003 | Saito et al. |
| 6,656,792 B2 | 12/2003 | Choi et al. |
| 6,798,013 B2 | 9/2004 | Gonzalez |
| 6,853,575 B2 | 2/2005 | Kang |
| 6,898,137 B2 | 5/2005 | Arimoto et al. |
| 6,924,969 B2 | 8/2005 | Hill |
| 7,224,024 B2 | 5/2007 | Forbes |
| 7,259,415 B1 | 8/2007 | Forbes |
| 7,271,433 B1 | 9/2007 | Forbes |
| 7,307,911 B1 | 12/2007 | Anand et al. |
| 7,338,862 B2 | 3/2008 | Huo et al. |
| 8,124,483 B2 * | 2/2012 | Schulz ............ 438/283 |
| 2002/0024873 A1 | 2/2002 | Tomishima et al. |
| 2004/0041206 A1 | 3/2004 | Bhattacharyya |
| 2004/0149353 A1 | 8/2004 | Hill |
| 2004/0213048 A1 | 10/2004 | Park et al. |
| 2005/0001232 A1 | 1/2005 | Bhattacharyya |
| 2005/0023613 A1 * | 2/2005 | Bhattacharyya ............ 257/348 |
| 2005/0044943 A1 | 3/2005 | Godeau et al. |
| 2005/0062088 A1 | 3/2005 | Houston |
| 2005/0077574 A1 | 4/2005 | Mouli |
| 2005/0128787 A1 * | 6/2005 | Mouli ............ 365/149 |
| 2006/0278926 A1 | 12/2006 | Mathew et al. |
| 2007/0006914 A1 * | 1/2007 | Lee ............ 136/261 |
| 2007/0252175 A1 | 11/2007 | Tang et al. |
| 2008/0061346 A1 | 3/2008 | Tang et al. |
| 2008/0061360 A1 | 3/2008 | Oh et al. |
| 2008/0079053 A1 | 4/2008 | Gonzalez et al. |
| 2008/0099808 A1 | 5/2008 | Burnett et al. |
| 2010/0105178 A1 | 4/2010 | Kim et al. |
| 2010/0252803 A1 | 10/2010 | Lee et al. |

OTHER PUBLICATIONS

Butt et al., "Scaling Limits of Double-Gate and Surround-Gate Z-RAM Cells," IEEE Transactions on Electron Devices, vol. 54, No. 9, Sep. 2007, pp. 2255-2262.

Chandramouli et al., "Design Considerations for High Performance Avalanche Photodiode Multiplication Layers," IEEE Transaction on Electron Devices, vol. 41, No. 5, May 1994, pp. 648-654.

Fazan et al., "Capacitor-less 1-T DRAM," 2002 IEEE Int'l. SOI Conf., pp. 10-13, Oct. 2002.

Fossum et al., "New Insights on 'Capacitorless' Floating-Body DRAM Cells," IEEE Electron Device Letters, vol. 28, No. 6, Jun. 2007, pp. 513-516.

Inoh et al, "FBC (Floating Body Cell) for Embedded DRAM on SOI," 2003 Symp. on VLSI Tech. Digest, Jun. 2003.

Munteanu et al., "Generation-Recombination Transient Effects in Partially Depleted SOI Transistors: Systematic Experiments and Simulations," IEEE Transactions on Electron Devices, vol. 45, No. 8, pp. 1678-1683, Aug. 1998.

Sallese et al., "Principles of the 1-T DRAM Concept on SOI," MIXDES 2002, 9th International Conference, Wroclaw, Poland, 19 pages.

Wann et al., "A Capacitorless DRAM Cell on SOI Substrate," IEEE, 1993, IEDM, pp. 635-638.

PCT International Search Report, International Application No. PCT/US2009/059943, issued May 17, 2010, three (3) Pages.

PCT Written Opinion of the International Searching Authority, International Application No. PCT/US2009/059943, issued May 17, 2010, four (4) pages.

Search Report issued by the Taiwan Intellectual Property Office, ROC (Taiwan) Patent Application No. 098135152, Dec. 20, 2012, one page (and one page English translation).

Supplementary European Search Report from the European Patent Office, European Application No. 09821037.0, dated Jan. 7, 2013, two (2) pages.

Examination Report from the European Patent Office, European Application No. 09821037.0, dated Jan. 7, 2013, eight (8) pages.

* cited by examiner

METHODS OF FORMING MEMORY CELLS, MEMORY CELLS, AND SEMICONDUCTOR DEVICES

CROSS-REFERENCE TO RELATED APPLICATION

This application is a continuation of U.S. patent application Ser. No. 12/252,495, filed Oct. 16, 2008, now U.S. Pat. No. 8,067,803, issued Nov. 29, 2011, the disclosure of which is hereby incorporated herein by this reference in its entirety.

TECHNICAL FIELD

The present invention relates to memory devices, more specifically to a dynamic random access memory device including a field effect transistor storage device.

BACKGROUND

Semiconductor memory, such as a random access memory (RAM), is an essential semiconductor device. A RAM device allows the user to execute both read and write operations on its memory cells. DRAM is a specific category of RAM containing an array of individual memory cells. DRAM devices are commonly used with computers and computer systems. Typically, each cell includes a capacitor for holding a charge and a transistor for accessing the charge held in the capacitor. The transistor is often referred to as the access transistor or the select device of the DRAM cell.

Figure 1:
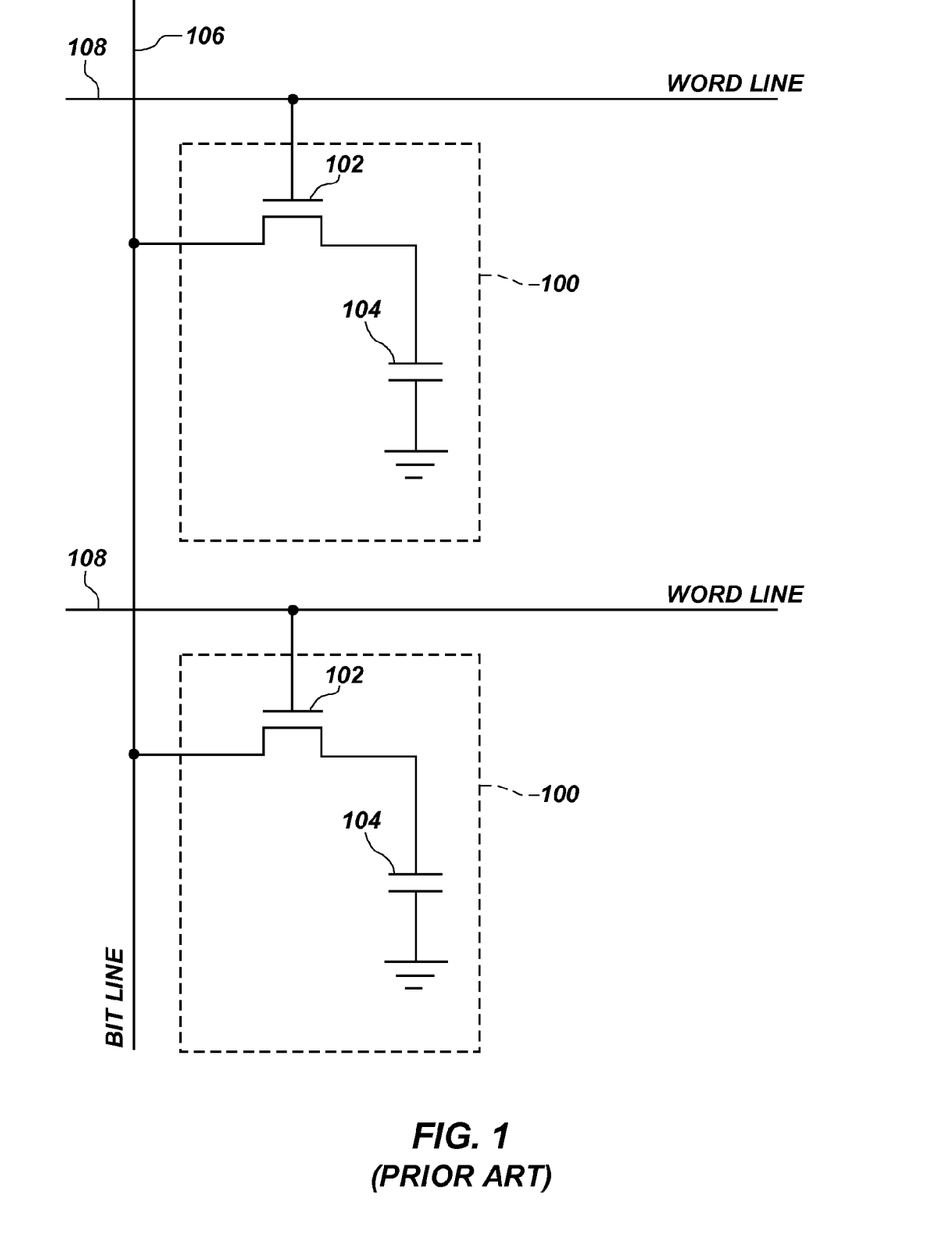
FIG. 1 is a schematic diagram of a pair of conventional DRAM cells.

FIG. 1 illustrates a portion of a DRAM memory circuit containing two neighboring DRAM cells 100. Each cell 100 contains a storage capacitor 104 and an access field effect transistor (FET) 102. For each cell, one side of the storage capacitor 104 is connected to a reference voltage (illustrated as a ground potential). The other side of the storage capacitor 104 is connected to the drain of the transistor device 102. The gate of the transistor device 102 is connected to a word line 108. The source of the transistor device 102 is connected to a bit line 106 (also known as a digit line). With the memory cell 100 components connected in this manner, the word line 108 controls access to the storage capacitor 104 by allowing or preventing the signal (representing a logic "0" or a logic "1") carried on the bit line 106 to be written to or read from the storage capacitor 104. Thus, each cell 100 may contain one bit of data (i.e., a "0" or "1").

As DRAM devices continue to physically shrink in size, it is difficult to provide capacitors in a small area with sufficient capacitance, typically greater than 20 femtoFarads (fF), in the case of a stacked capacitor DRAM cell. In addition, it is difficult to provide an access transistor with good off-state leakage characteristics for refresh operations and good on-state characteristics to write into the cell. Several designs have been proposed to address these issues.

One such design is a silicon-on-insulator (SOI) based memory cell that eliminates the need for a capacitor. See, H. Wann et al., "A Capacitorless DRAM Cell on SOI Substrate," Tech. Digest, Int'l Electron Device Mtg., pp. 635-638, December 1993; P. Fazan et al., "Capacitor-less 1-T DRAM," 2002 IEEE Int'l. SOI Conf., pp. 10-13, October 2002; K. Inoh et al., "FBC (Floating Body Cell) for Embedded DRAM on SOI," 2003 Symp. on VLSI Tech. Digest, June 2003. Such references discuss one-transistor capacitor-less (1T/0C) DRAM cells and the operation of a DRAM circuit employing such cells.

Such capacitor-less cells, however, can suffer from poor performance characteristics related to retention time, access time, distribution characteristics, and reliability. In a 1T/0C DRAM cell, carriers are generated in the substrate bulk to write a "1," and are pulled out from the substrate bulk to write a "0." In a 1T/0C DRAM cell employing a planar SOI device, carrier generation can present problems. For example, when impact ionization is essential for operation of such a DRAM cell, device reliability can be poor and efficiency can be reduced at higher temperatures due to a decrease in ionization rate and, therefore, quantum yield. Also, a planar device can result in limited operations that consume power because the transistor must be in an on-state. Further, when the planar SOI devices are physically reduced in size, charge storage can be limited due to the reduced active area.

DETAILED DESCRIPTION OF THE INVENTION

In the following detailed description, reference is made to the accompanying drawings, which form a part hereof and illustrate specific embodiments in which the invention may be practiced. In the drawings, like reference numerals describe substantially similar components throughout the several views.

The terms "wafer" and "substrate" are to be understood as including silicon, silicon-on-insulator (SOI), silicon-on-sapphire (SOS), and silicon-on-nothing (SON) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

A memory cell and a method of forming the memory cell comprises a storage transistor at a surface of a substrate. The storage transistor comprises a body portion between first and second source/drain regions, wherein the source/drain regions are regions of a first conductivity type. The storage transistor also comprises a gate structure that wraps at least partially around the body portion in at least two spatial planes. A bit line is connected to the first source/drain region and a word line is connected to the gate structure.

Embodiments of the present invention provide a storage transistor having a wrapped-around gate structure for use in a memory cell, and particularly for use in a one transistor capacitor-less (1T/0C) DRAM cell. The storage transistor is configured to employ any of the following means to generate charge to be stored in the storage transistor: a) impact ionization; b) band-to-band tunneling; and c) channel-initiated secondary hot electrons (CHISEL). A combination of these three methods can be used to increase carrier generation efficiency. Carriers, e.g., holes, generated by these methods are stored in the body of the storage transistor during a write operation.

Impact ionization generates carriers when a first generation high-energy electron undergoes a collision (scattering event) with the lattice of the substrate. For example, a first generation high-energy electron in the conduction band undergoes a collision, thereby liberating a second generation electron from the valence band. The second generation electron leaves behind a hole. High-energy first generation carriers lose energy upon collision as energy is transferred to the second generation electron.

Impact ionization is a strong function of carrier energy. Impact ionization is strongly dependent on temperature and is aided by a high electric field, but is not entirely dependent upon the electric field. The frequency of impact ionization decreases at higher temperatures due to increased lattice scattering. Further, impact ionization also depends strongly on the energy band structure of the substrate, which is an intrinsic material property. See V. Chandramouli et al., "Design Considerations for High Performance Avalanche Photodiode Multiplication Layers," IEEE Transactions on Electron Devices, vol. 41, pp. 648-654, 1994.

Band-to-band tunneling of carriers occurs when there is significant band bending in the presence of electric fields in a device. Like impact ionization, band-to-band tunneling results in charge carrier amplification. There are, however, significant differences. Band-to-band tunneling is strongly dependent on electric fields and is independent of temperature. In MOS transistors, band-to-band tunneling is a primary cause of gate-induced-drain-leakage (GIDL).

CHISEL mechanism also results in carrier amplification. As is known in the art, carrier generation through CHISEL mechanisms involve impact ionization and second generation carrier energy gain in the presence of an electric field.

According to an embodiment of the invention, a fin-type field effect transistor (FinFET) is provided for a 1T/0C DRAM cell. A FinFET is a multiple-gate FET and, typically, is a fully depleted (FD) SOI device employed in advanced logic technologies. FD-FinFETs are typically designed to eliminate floating body effect (FBE). For an SOI FET, there is often no contact to the body portion between source and drain regions so that the body is floating. Floating body effect causes fluctuation in the threshold voltage for the device from charge build up in the body, which is detrimental to conventional operation of a FET.

A FD-SOI device is not suited for charge storage as needed in a DRAM cell. When a FinFET is to be used as a storage device, it is advantageous to have FBE. Therefore, embodiments of the invention provide a partially depleted (PD) FinFET with increased FBE over a FD-SOI device. See D. Munteanu et al., "Generation-Recombination Transient Effects in Partially Depleted SOI Transistors: Systematic Experiments and Simulations," IEEE Transactions on Electron Devices, vol. 45, No. 8, pp. 1678-83, August 1998, describing the most frequent transient phenomena due to FBE in PD SOI MOSFETs.

Figure 2:
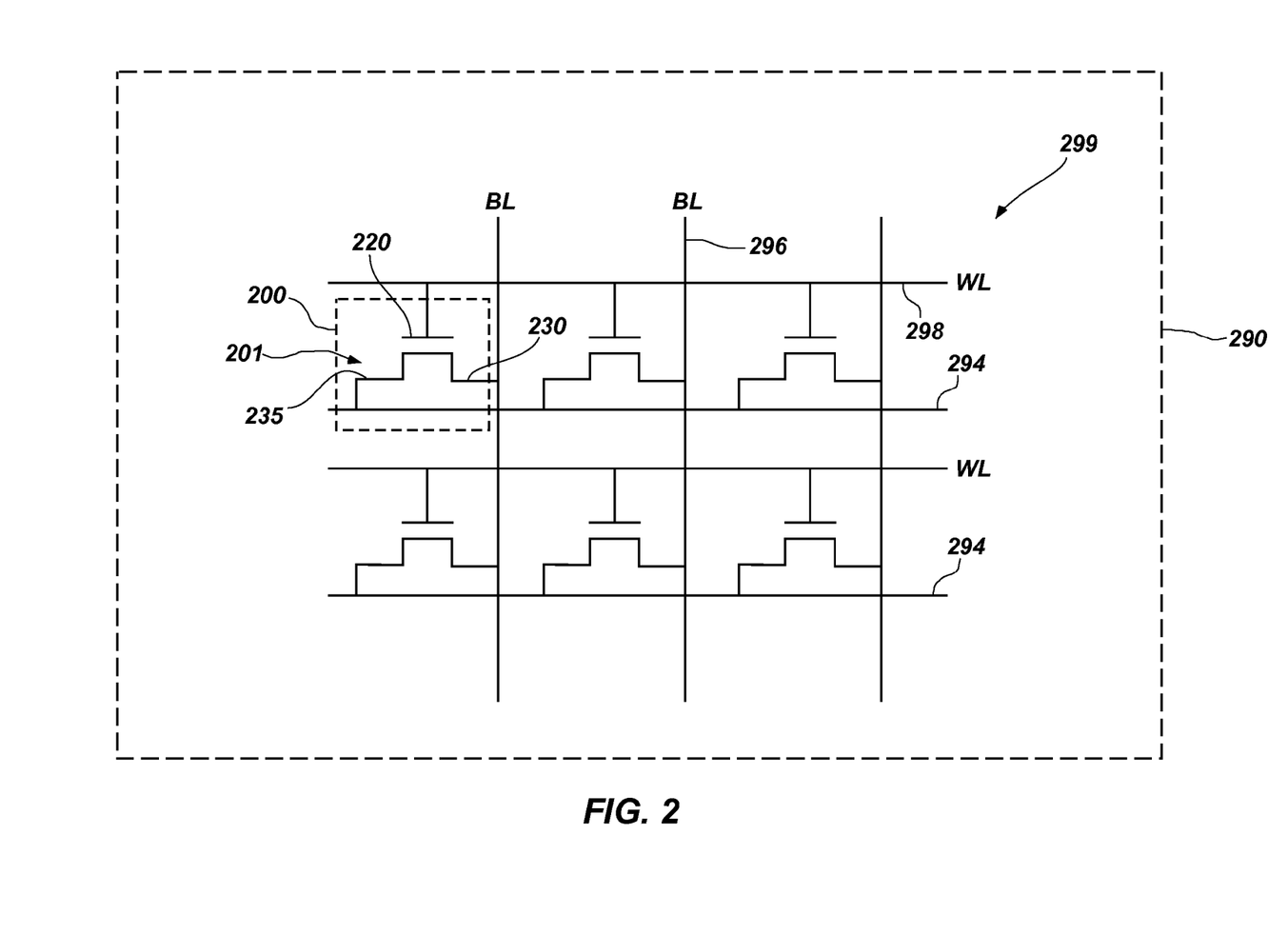
FIG. 2 is a schematic diagram of a memory array according to an exemplary embodiment of the invention.

FIG. 2 is a schematic diagram of a memory array 299 according to an embodiment of the invention. Memory array 299 is a DRAM memory array that includes a DRAM cell 200 described herein. All cells of memory array 299 are DRAM cells 200. Memory array 299 can be included on a semiconductor chip 290.

Figure 3:
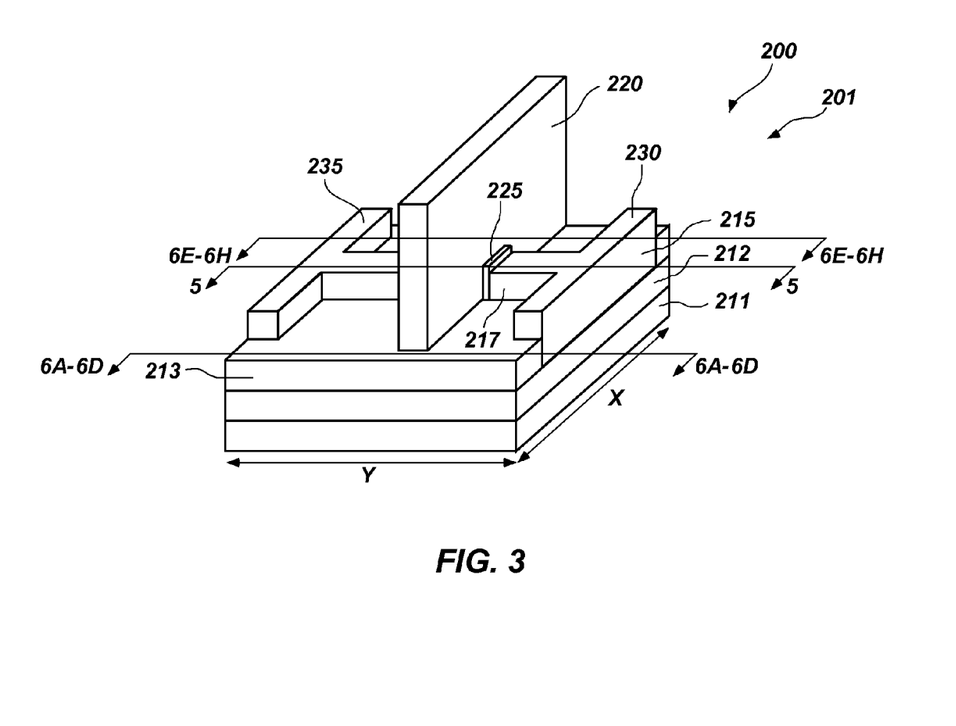
FIG. 3 is a three-dimensional representation of a portion of a DRAM cell constructed according to an embodiment of the invention.

FIG. 3 is a three-dimensional representation of a portion of a DRAM cell 200 constructed according to an embodiment of the invention. DRAM cell 200 is a 1T/0C cell having a FinFET 201. As illustrated, the FinFET 201 is an N-channel device.

FinFET 201 is a partially depleted (PD) SOI device. Accordingly, FinFET 201 is formed of a substrate layer 215 over a buried oxide layer (BOX) 212. BOX 212 overlies a base silicon layer 211. There is also an isolation region 213 for isolating FinFET 201 from neighboring devices. As illustrated, isolation region 213 is a shallow trench isolation region.

As illustrated in FIGS. 2 and 3, a gate structure 220 of a FinFET 201 is connected to a word line 298. FinFET 201 includes a body 217 between a source/drain region 235 and a source/drain region 230. A source/drain region 230 of FinFET 201 is connected to a bit line 296 and source/drain region 235 of FinFET 201 is connected to a line 294. As FinFET 201 is an N-channel device, holes are stored in body 217 to write a "1" into cell 200 and ejected from body 217 to write a "0" into cell 200.

The body 217 is a structure protruding from a surface of the substrate layer 215 and has a wall or fin-like shape. As FinFET 201 is an SOI device, body 217 is floating. There is a gate oxide layer 225 in contact with the body 217. Over the oxide layer 225 is a gate structure 220. Gate structure 220 wraps around a portion of the body 217 to form gates 220a, 220b, and 220c (see FIG. 4). Gates 220a and 220b are on opposing sides of body 217, and gate 220c is on a top surface of body 217. As illustrated, gate structure 220 wraps around three sides of body 217 with gates 220a, 220b, and 220c being interconnected. There are also sidewall spacers 226 (see FIG. 5) on sidewalls of gate structure 220. For clarity, sidewall spacers 226 are not depicted in FIGS. 3 and 4.

Figure 4:
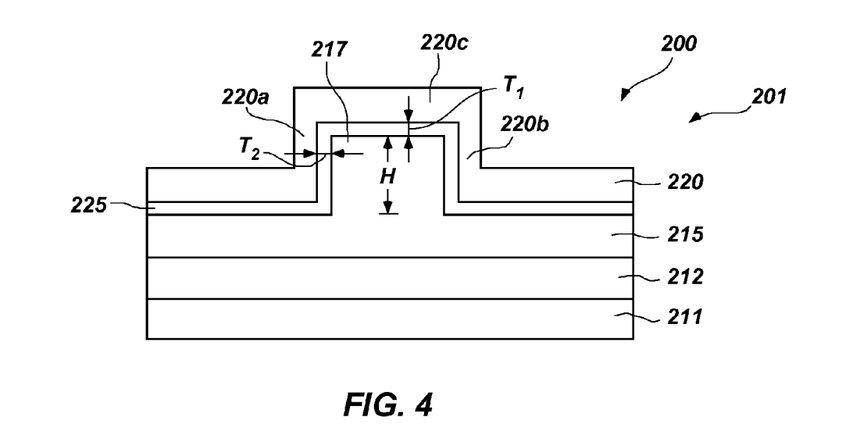
FIG. 4 is a cross-sectional view of the memory cell of FIG. 3 along the X direction.

Because gate structure 220 wraps around three sides of body 217, the gates provide good control in the sub-threshold and linear operating regions. Additionally, due to superior gate control, FinFET 201 can be formed to have a low threshold voltage. FinFET 201 can have a threshold voltage between approximately 300 mV to approximately 700 mV, when no charge is stored in body 217. As illustrated, the threshold voltage of FinFET 201 is approximately 500 mV. A low threshold voltage enables low power operation, particularly where band-to-band tunneling is used to write a "1" into cell 200. Furthermore, FinFET 201 is more easily scaled to smaller physical dimensions and lower operating voltages than a conventional planar SOI FET.

Continuing with reference to FIGS. 3 and 4, charge carriers, e.g., holes, are stored in body 217. As body 217 is a fin structure, it is better isolated from any source/drain regions in comparison to a planar device. Therefore, charge can be stored longer in body 217 improving data retention characteristics of DRAM cell 200.

FIG. 4 is a cross-sectional view of FinFET 201 along the X direction at a point over body 217. As illustrated in FIG. 4, gate oxide layer 225 has a thickness, $T_1$, on a top surface of body 217 and a thickness, $T_2$, on sidewalls of body 217. As illustrated, $T_1$ is greater than $T_2$. Using a thinner oxide on the sidewalls of body 217 increases band-to-band tunneling. The increased band-to-band tunneling increases carrier generation in the channel during a write "1" operation. Further, band-to-band tunneling typically does not lead to long-term device reliability degradation, as can happen where impact ionization and CHISEL are primarily used for carrier generation. Therefore, enhancing carrier generation through band-to-band tunneling can improve device reliability.

Also, as illustrated in FIG. 4, body 217 has a height H. As DRAM cell 200 is scaled down in size, the body height H can be increased to maintain the charge capacity of body 217.

Figure 5:
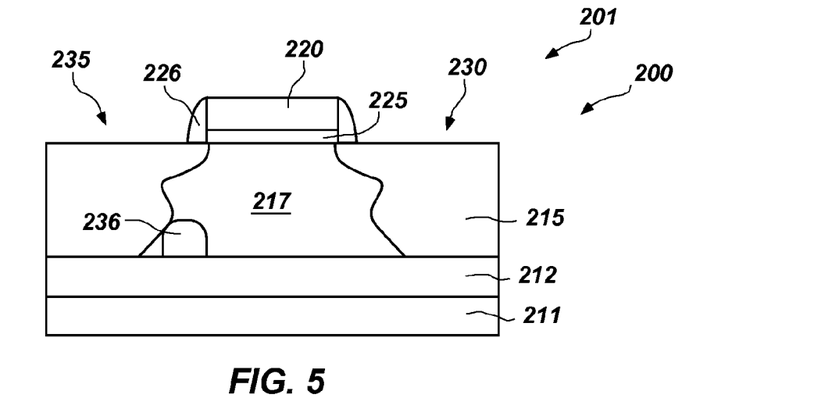
FIG. 5 is another cross-sectional view of the memory cell of FIG. 3 along the X direction.

FIG. 5 is a cross-sectional view of FinFET 201 along the Y direction at a point over gate structure 220 along line 5-5 of FIG. 3. FIG. 5 illustrates sidewall spacers 226 on sidewalls of gate structure 220. Also, FIG. 5 illustrates source/drain regions 235, 230, which are heavily doped N-type regions. To achieve a PD device, a portion of body 217 is doped to a P-type conductivity, while other portions of body 217 are undoped. As illustrated in FIG. 5, the side of body 217 adjacent to source/drain region 235 includes a P-type region 236, while the side adjacent to source/drain region 230 is undoped.

As illustrated, region 236 is a heavily doped P-type halo region. Halo region 236 is located below a point where source/drain region 235 and gate structure 220 overlap and contacts with a bottom portion of source/drain region 235 and contacts a top surface of BOX 212. Halo region 236 ensures that FinFET 201 is a PD device and also increases carriers generated by CHISEL mechanisms, thereby increasing programming efficiency. A side of body 217, which is adjacent to where bit line 296 (FIG. 2) is connected, has undoped portions providing a large programming window and allowing full depletion of body 217 on the side enhancing write "0" operations.

As illustrated, the fabrication of a single DRAM cell 200 is now described with reference to FIGS. 6A through 6H. FIGS. 6A through 6D are cross-sectional views of a memory cell 200 along the X direction at a point over body 217 along line 6A-6D. FIGS. 6E through 6H are cross-sectional views of memory cell 200 along the Y direction at a point over gate structure 220 along line 6E-6H. The fabrication of all memory cells in memory array 299 can proceed simultaneously in the same manner. No particular order is required, except for those requiring the results of prior actions. Accordingly, the order may be altered.

Figure 6A:
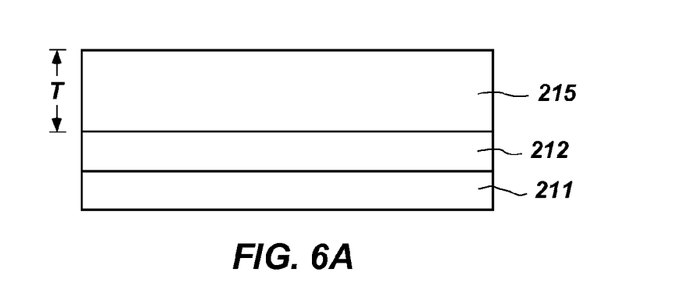
FIG. 6A is a cross-sectional view of the memory cell of FIG. 2 along the X direction at an initial stage of processing.

FIG. 6A illustrates the initial stage of fabrication of DRAM cell 200. The fabrication of DRAM cell 200 begins with an undoped SOI material comprised of three portions of layers that have under gone processing to form 211, 212, 215. The SOI material can be fabricated by suitable known methods, such as a separation by implanted oxygen process or layer transfer technique. As illustrated, the thickness T of the substrate layer 215 on the buried oxide layer 212 is greater than approximately 2000 Angstroms. Silicon base layer 211 is located under the buried oxide layer 212. Base layer 211 and substrate layer 215 can be layers of monocrystalline silicon.

Isolation regions 213 (see FIG. 3) are formed within the substrate layer 215 and filled with a dielectric material, an oxide material, a silicon oxide, such as SiO or $SiO_2$; an oxynitride; a nitride material, such as silicon nitride; silicon carbide; a high temperature polymer; or other suitable dielectric material. As noted above, illustratively, isolation regions 213 are STI regions and the dielectric material is a high-density plasma (HDP) oxide, a material that has a high ability to effectively fill narrow trenches.

Figure 6B:
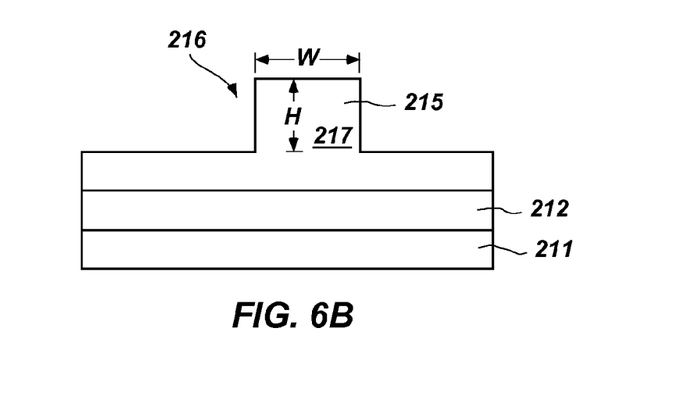
FIG. 6B is a cross-sectional view of the memory cell of FIG. 3 along the X direction at an intermediate stage of processing.

As illustrated in FIG. 6B, a silicon wall structure 216 is etched in substrate layer 215, which forms the "fin" portion of the FinFET. Fin structure 216 may have a width W of between approximately 300Å to approximately 1000Å, and a height of between approximately 500Å to approximately 4000Å. As illustrated, the fin width W is approximately 700Å and the fin height H is approximately 2000Å. As noted above, the fin height H can increase as the fin width W decreases. In this example, DRAM cell 200 includes only one fin structure 216. A FinFET for DRAM cell 200, however, can be formed having more than one fin structure 216. Fin structure 216 also forms body 217 of FinFET 201. Fin structure 216 can be formed by conventional methods, such as optical lithography or spacer defined lithography.

Figure 6C:
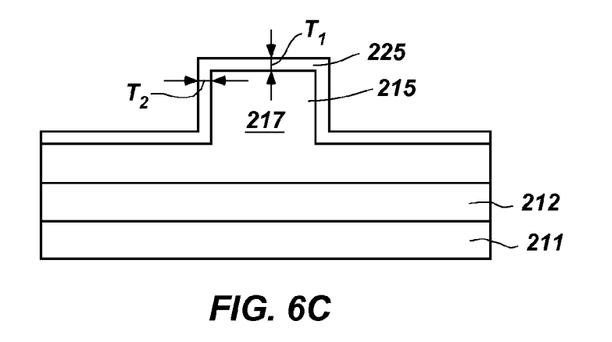
FIG. 6C is a cross-sectional view of the memory cell of FIG. 3 along the X direction at an intermediate stage of processing.

An insulating layer 225 is grown or deposited by conventional methods on substrate layer 215, as shown in FIG. 6C. Insulating layer 225 is preferably a high dielectric constant (high-k) material, although silicon dioxide ($SiO_2$) or oxynitride (ON) may be used. A high-k material is a material having a dielectric constant greater than that of $SiO_2$. Also, the term dielectric constant as used herein, refers to the intrinsic property of a particular bulk material, rather than the effective dielectric constant of a material as it is practically employed, which may be affected by material thickness or other factors. Examples of high-k materials include, but are not limited to, hafnium oxide, nitrided hafnium oxide (HfON), aluminum-doped hafnium oxide (HfAlO), aluminum oxide ($Al_2O_3$), zirconium oxide ($ZrO_2$), tantalum pentoxide ($Ta_2O_5$), lanthanum oxide ($La_2O_3$), titanium oxide ($TiO_2$), and yttrium oxide ($Y_2O_3$). Layer 225 may have a thickness from approximately 10Å to approximately 100Å. As noted above, the thickness $T_1$ of oxide layer 225 on a top surface of body 217 is greater than the thickness $T_2$ of the oxide layer 225 on sidewalls of body 217. As illustrated, thickness $T_1$ is approximately 50Å and thickness $T_2$ is approximately 40Å.

Figure 6D:
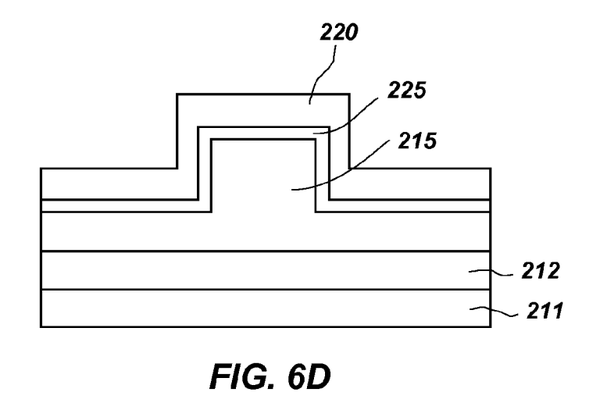
FIG. 6D is a cross-sectional view of the memory cell of FIG. 3 along the X direction at an intermediate stage of processing.

As illustrated in FIG. 6D, a gate structure or conductive layer 220 is deposited over the oxide layer 225. Conductive layer 220 will serve as the gate structure for the subsequently formed FinFET. Conductive layer 220 may be a layer of polysilicon or $Si_xGe_{1-x}$, which may be heavily doped to, e.g., N-type or P-type. Also, conductive layer 220 may be a metal gate formed of, for example, Ti, TaN, WN, or W, among others. The functionality of conductive layer 220 can be changed, as desired, by selecting appropriate materials. Conductive layer 220 may be formed by conventional deposition methods, such as chemical vapor deposition (CVD) or plasma chemical vapor deposition (PECVD), as well as others. The layers 225 and 220 may be patterned and etched to form the FinFET 201 gate structure.

Figure 6E:
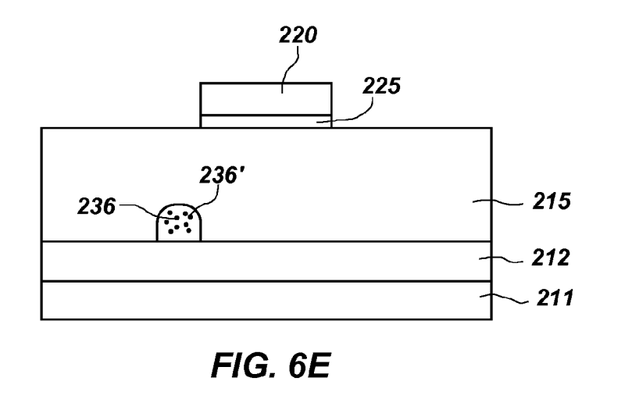
FIG. 6E is a cross-sectional view of the memory cell of FIG. 3 along the Y direction at an intermediate stage of processing.
Figure 6F:
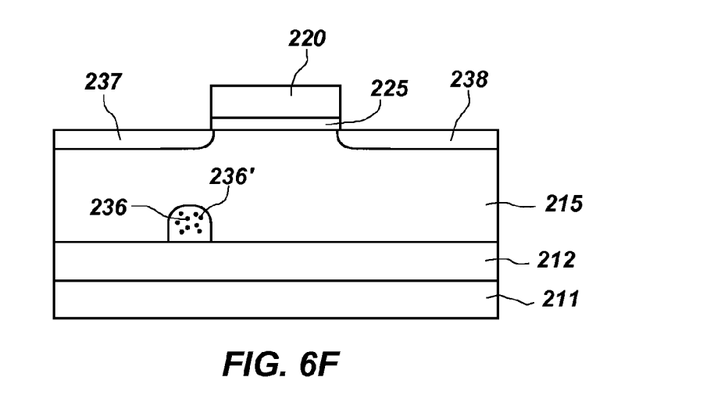
FIG. 6F is a cross-sectional view of the memory cell of FIG. 3 along the Y direction at an intermediate stage of processing.
Figure 6G:
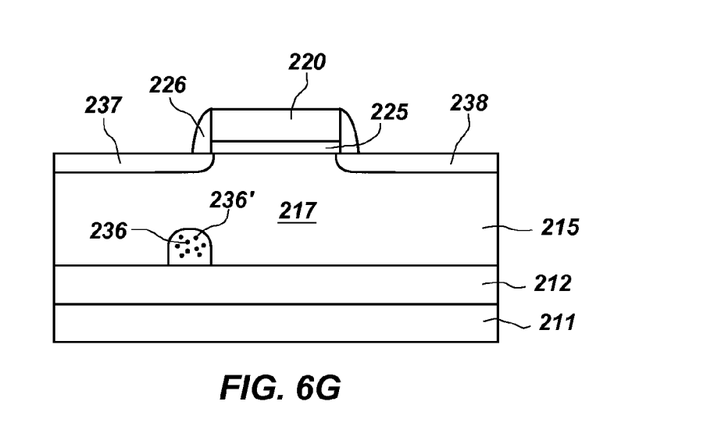
FIG. 6G is a cross-sectional view of the memory cell of FIG. 3 along the Y direction at an intermediate stage of processing.

FIGS. 6E through 6G are cross-sectional views similar to that shown in FIG. 4 and depict further fabrication steps. As shown in FIG. 6E, a halo implant is made on a side of gate structure 220 adjacent to source/drain region 235 where line 294 will be connected to form a heavily doped halo region 236. For this, gate structure 220 and the opposing side of substrate layer 215 are masked (not illustrated) and dopants are implanted into the substrate layer 215 below and approximately aligned with an edge of gate structure 220. In this example, halo region 236 is formed contacting a top surface of buried oxide layer (BOX) 212.

A P-type dopant, such as boron or indium is implanted in substrate layer 215. The implant dose can be between approximately 5e12 atoms/cm$^2$ to approximately 1e14 atoms/cm$^2$. In this example the implant dose is approximately 1e13 atoms/cm$^2$. Multiple implants can be used to tailor the profile of the halo region 236. Also, angled implantation can be conducted to form halo region 236, such that implantation is carried out at angles other than 90 degrees relative to the top surface of substrate layer 215.

After the implanting of a P-type dopant to form halo region 236, the halo region 236 is further implanted with oxygen at a low dosage level with a subsequent annealing process so that nano-particles, nano-inclusions or nano-crystals, also termed as recombination sites, of silicon dioxide ($SiO_2$) are formed in the halo region 236 to create local nanoscale dielectric islands. The surfaces of the nano-particles or nano-crystals create trap sites 236' in the halo region 236, which can be charged by any known electron-hole pair generation mechanisms resulting in a change in channel potential that can be sensed. When a forward bias is created near the junction, this results in lowering of this potential barrier resulting in removal of trapped charge, therefore, erasing the cell. The trap sites 236' formed in the halo region 236 can also act as recombination centers when the insulator material, semiconductor channel material, is selected to minimize recombination. For example, it is well known that the backside of an SOI substrate has trap sites, but FBE cells are conventionally fabricated on SOI substrates without such trap sites being present. The inclusion of nano-particles 236' in the halo region 236 forming recombination sites enhances a write "0" operation and serves to increase the programming window for DRAM cell 200.

Alternately, after the implanting of a P-type dopant to form halo region 236, the halo region 236 is further implanted with rare-earth elements 236' such as erbium (Er), praseodymium (Pr), or thulium (Tm), or any combination thereof or all combined, to act as generation centers, more than acting as recombination centers created due to defects to increase charge generation per unit volume of the halo region 236. When embedded in a semiconductor, rare-earth elements reduce the ionization threshold energy (and fields) needed for impact ionization to create excess e-p pairs. These carriers further gain energy from the existing field to create additional carriers. Unlike impact ionization, which is a reliability concern, doping silicon or germanium with rare-earth elements 236' provides a way to crate excess e-p pairs, which are essential for a FBE cell. While erbium (Er), praseodymium (Pr), or thulium (Tm), or any combination thereof or all combined are the preferred rare-earth elements to be implanted, other rare-earth elements of the Lanthanide series of elements may be used.

As shown in FIG. 6F, lightly doped source/drain (LDD) implants are performed by known techniques to provide LDD regions 237 and 238. Each LDD region 237, 238 is approximately aligned with an edge of gate structure 220. LDD regions 237, 238 are N-type regions, the same conductivity type as subsequently formed source/drain regions 235, 230.

Alternatively, LDD regions 237 and 238 can be formed separately using separate mask levels. For example, the mask used forming halo region 236 can remain when LDD region 237 is formed.

FIG. 6G depicts the formation of sidewall spacers 226 on sidewalls of gate structure 220. As illustrated, sidewall spacers 226 appear as oxide spacers, any appropriate dielectric material, such as silicon dioxide, silicon nitride, an oxynitride, oxide/nitride (ON), nitride/oxide (NO), oxide/nitride/oxide (ONO), or Tetraethyl Orthosilicate (TEOS), among others, formed by methods known in the art.

Figure 6H:
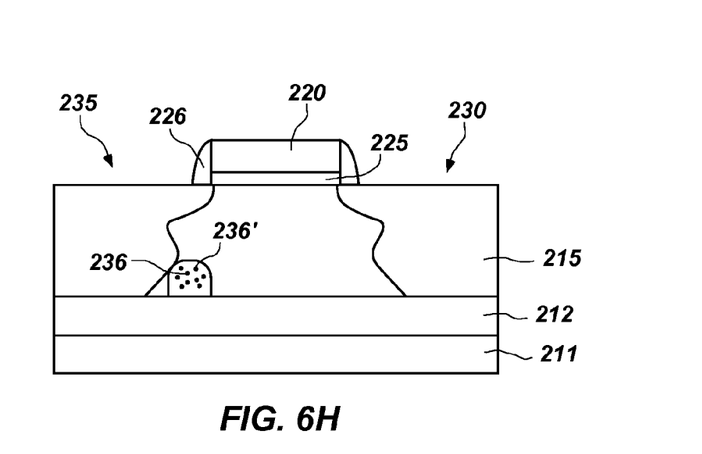
FIG. 6H is a cross-sectional view of the memory cell of FIG. 3 along the Y direction at an intermediate stage of processing.

Source/drain regions 235, 230 can be implanted by known methods to achieve the structure shown in FIG. 6H. Source/drain regions 235, 230 are formed as heavily doped N-type regions within substrate layer 215. Source/drain regions 235, 230 are formed contacting BOX 212 and are approximately aligned with edges of sidewall spacers 226. N-type dopants such as phosphorus, arsenic, or antimony can be used.

Conventional processing methods can be used to complete DRAM cell 200. For example, insulating and metallization layers to connect a bit line, word line, and source line to cell 200 may be formed. The entire surface can be covered with a passivation layer (not shown) of, for example, silicon dioxide, borosilicate glass (BSG), phosphosilicate glass (PSG), or borophosphosilicate glass (BPSG), which is CMP planarized and etched to provide contact holes, which are then metallized to provide contacts. Conventional layers of conductors and insulators can also be used to connect cell 200 to peripheral circuitry.

Figure 7:
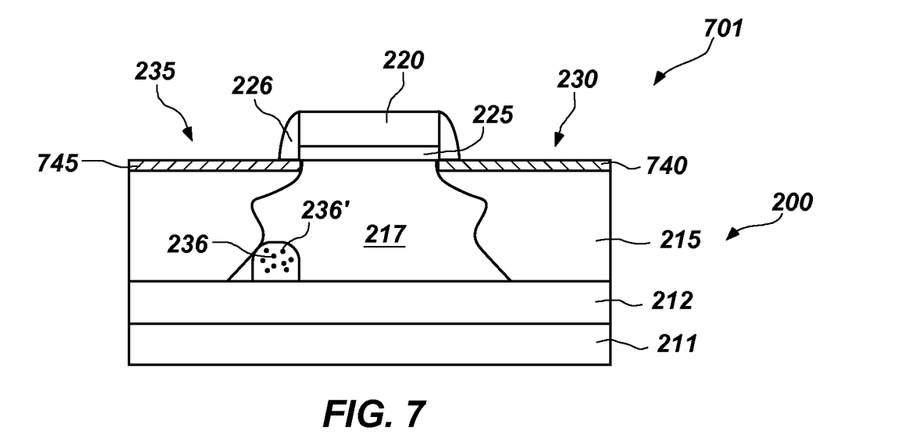
FIG. 7 is a cross-sectional view of a memory cell according to another exemplary embodiment of the invention.
Figure 8:
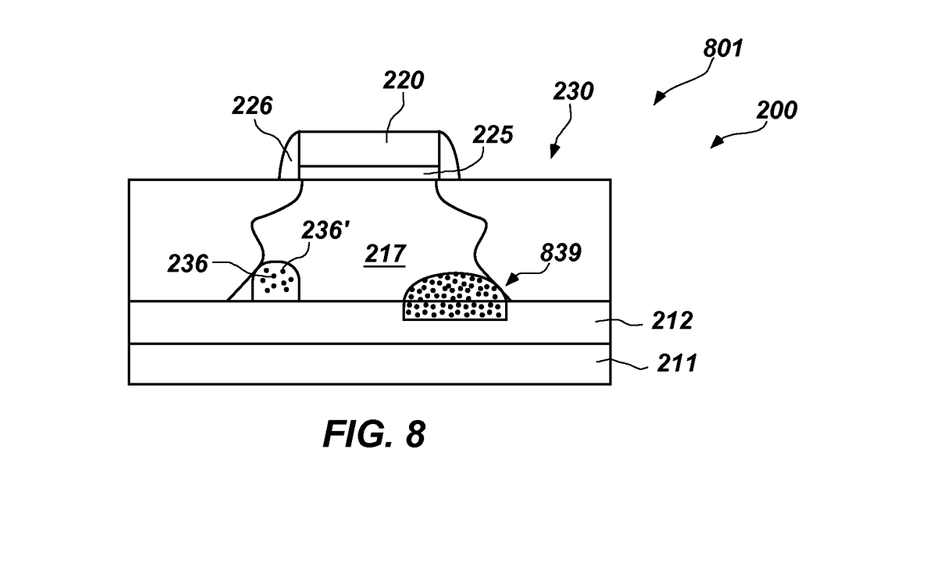
FIG. 8 is a cross-sectional view of a memory cell according to another exemplary embodiment of the invention.

FIGS. 7 and 8 are cross-sectional views of cell 200 according to additional embodiments of the invention. Each of the embodiments illustrated in FIGS. 7 and 8 can be generally formed as described above in connection with FIGS. 6A through 6H as described herein.

As illustrated in FIG. 7, DRAM cell 200 can include FinFET 701 having a silicide layer 745 in contact with a surface of substrate layer 215 over source/drain region 235 and a silicide layer 740 in contact with a surface of substrate layer 215 over source/drain region 230. Silicide layers 745, 740 can have a thickness between approximately 50Å and approximately 500Å. In the example of FIG. 7, silicide layers 745, 740 are approximately 150Å thick. Silicide layers 745, 740 can be, for example, cobalt silicide, tantalum silicide, nickel silicide, platinum silicide, or titanium silicide.

Silicide layer 745 can be a different silicide than silicide layer 740. Silicide layers 745, 740 can be formed by methods known in the art, such as deposition of a metal layer followed by an annealing step. Layers 745, 740 are formed such that the Schottky barrier height between one of source/drain regions 235, 230 and body 217 is higher than between the other of source/drain regions 235, 230 and body 217. Schottky barrier height depends on the work-function of the silicide. A higher work-function tends to result in a higher Schottky barrier.

As illustrated in FIG. 7, the Schottky barrier height is the same on the source/drain region 235 side adjacent to where line 294 (see FIG. 2) is to be connected. Alternatively, drain silicide layer 740 can be omitted and there can be a silicide layer 745 over only source/drain region 235.

Also, an increased dopant level augments the Schottky barrier. Accordingly, the dopant level in the source/drain region 235 can be greater than that in the source/drain region 230. In such a case, source/drain regions 235, 230 can be formed in separate steps.

Providing a higher Schottky barrier on the side of FinFET 701 adjacent to line 294 serves to increase carrier generation in the body 217 due to gate tunneling effect when FinFET 701 is in an on-state. Gate tunneling causes a tunneling current from the gate to the body 217 increasing the body charge. Additionally, such a Schottky barrier increases high-energy carriers, thereby increasing the probability of impact ionization.

Referring to FIG. 8, DRAM cell 200 can include a FinFET 801 having an inert dopant region 839. Inert dopant region 839 is below an edge of gate structure 220 on the side of body 217 opposite to halo region 236 and adjacent to source/drain region 230. Region 839 has an amorphous dopant profile. Illustratively, the peak of the dopant profile lies within buried oxide layer (BOX) 212. Region 839 is formed by implanting inert ions such as argon, germanium, silicon, or other appropriate material. The implant dose used to form region 839 is within the range of approximately 5e12 atoms/cm$^2$ to approximately 1e16 atoms/cm$^2$, and is desirably approximately 1e15 atoms/cm$^2$.

Inert dopant region 839 enhances a write "0" operation by providing recombination centers in BOX 212 on the side of FinFET 801 adjacent to bit line 296 (FIG. 2). This also serves to increase the programming window for DRAM cell 200.

Figure 9A:
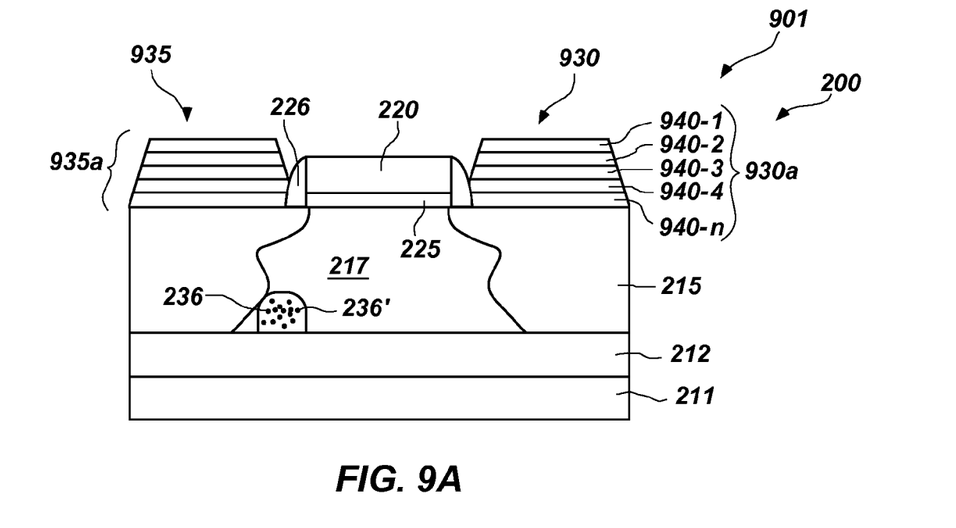
FIG. 9A is a cross-sectional view of a memory cell according to another exemplary embodiment of the invention.

FIG. 9A illustrates FinFET 901, which can be included in DRAM cell 200. FinFET 901 has source/drain regions 935, 930, which are raised (elevated) such that raised portions 935a, 930a share a same horizontal spatial plane as gates 220a and 220b on sidewalls of body 217 (FIG. 4). The raised portions 935a, 930a are an epitaxial layer grown over substrate layer 215 by known methods. Illustratively, raised portions 935a, 930a include multiple layers. Portions 935a, 930a can have any number of layers, which can be formed of two or more different materials having different band gaps. Illustratively, portions 935a, 930a include layers 940-1 through 940-n, which are alternating layers of $Si_xGe_{1-x}$ and $Si_yGe_{1-y}$, where x does not equal y.

Figure 9B:
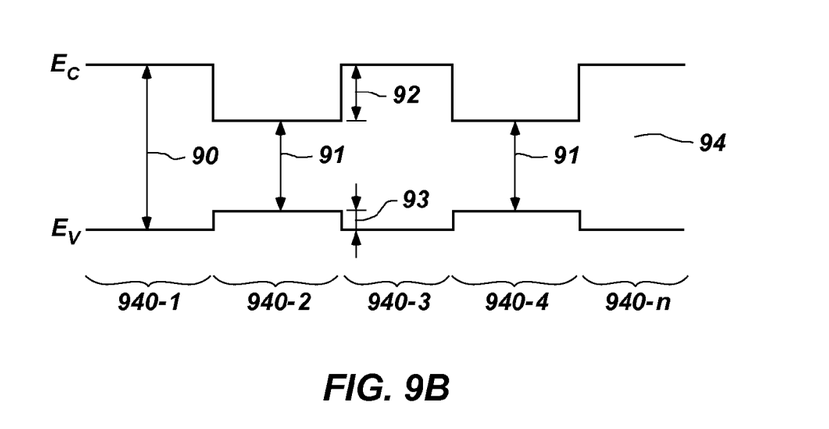
FIG. 9B is an energy band diagram for a portion of the memory cell of FIG. 9A.

FIG. 9B is an energy band diagram illustrating the band energies of layers 940-1 through 940-n of raised portions 935a, 930a (FIG. 9A). "Ec" represents the energy level of the conduction band and "Ev" represents the energy level of the valence band. Between Ec and Ev is the forbidden gap 94, where carriers (electrons or holes) ideally do not have any allowed energy state.

As shown in FIG. 9B, each layer has a different band gap than an adjacent layer. Illustratively, layers 940-1, 940-3, and 940-n are formed of a first material, $Si_xGe_{1-x}$, and layers 940-2 and 940-4 are formed of a second material, $Si_yGe_{1-y}$. In the example of FIG. 9B, the first material has a greater band gap than the second material. Accordingly, there is a greater difference in Ec and Ev, represented by reference numeral 90, for the first material layers 940-1, 940-3, and 940-n than for the second material layers 940-2 and 940-4, represented by reference numeral 91. The difference between the levels of Ec for the first and second materials is illustrated by reference numeral 92.

Carriers are accelerated through the layers in the presence of an electric field and gain energy. In the example of FIGS. 9A and 9B, electrons gain energy because of the difference between the levels of Ec 92 for the materials. Thereby, carrier injection velocity in source/drain region 935 is increased improving the probability for impact ionization.

Illustratively, the difference between the levels of Ev for the first and second materials, represented by reference numeral 93, is less than the difference between the levels of Ec for the first and second materials 92. Accordingly, holes gain less energy than electrons. Where FinFET 901 is a P-channel device, source/drain regions 935, 930 can be configured such that hole injection velocity in the source/drain region 935 is increased. In such a case, the difference of Ec between the first and second materials can be greater.

Figure 10:
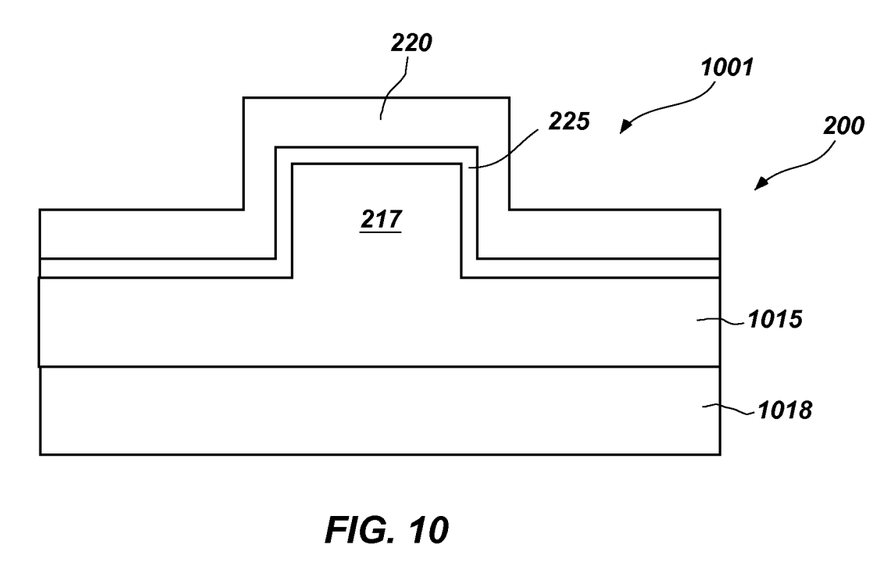
FIG. 10 is a cross-sectional view of a memory cell according to another exemplary embodiment of the invention.

FIG. 10 illustrates FinFET 1001, which can be included in DRAM cell 200. FinFET 1001 can have the same structure as any of the FinFETs described above in connection with FIGS. 2 through 9, except that FinFET 1001 is not fowled on an SOI substrate. Instead, FinFET 1001 is formed on a semiconductor substrate 1015. Accordingly, FinFET 1001 is not over a buried oxide layer.

Instead, memory cell 200 includes a heavily doped N-tub layer 1018 underlying a P-type substrate 1015. N-tub layer 1018 creates a barrier for minority carriers. N-tub layer 1018 can be formed by techniques known in the art prior to forming devices of memory cell 200, such as FinFET 1001. Although FinFET 1001 does not provide the benefits of an SOI substrate, it is a cost effective alternative.

The features described above in connection with FIGS. 7 through 10 need not be employed in isolation. Thus, according to the further embodiments of the invention, features described above in connection with FIGS. 7 through 10 can be combined in a single DRAM cell 200. For example, and without being limiting, DRAM cell 200 can include a FinFET having an inert dopant region and raised source and drain regions.

Although a DRAM cell 200 of the above embodiments is described as including a FinFET, the invention is not limited to a storage transistor with a body having a fin structure. The invention can include any transistor device having a wrapped-around gate structure. That is, a DRAM cell 200 can include a storage transistor that includes a gate structure that wraps at least partially around the body portion of the transistor in at least two spatial planes. For example, DRAM cell 200 can include a cylindrical or surround-gate that wraps around sidewalls of a pillar-shaped body or an omega FET, among others.

Although the above embodiments are described with respect to an N-channel device, the invention is also applicable to a DRAM cell 200 that includes a P-channel device. Where DRAM cell 200 includes a P-channel device, the conductivity types of the structures would change, as is known in the art. For example, source and drain regions would be P-type regions.

The above description and drawings are exemplary and illustrate embodiments that achieve the objects, features and advantages of the present invention. It is not intended that the present invention be limited to the illustrated embodiments. Any modification of the present invention which comes within the spirit and scope of the following claims should be considered part of the present invention. Accordingly, the invention is not limited by the foregoing description or drawings, but is only limited by the scope of the appended claims.

What is claimed is:

1. A memory cell, comprising:
    a storage transistor at a surface of a substrate comprising:
        a first doped region comprising at least one of a source and a drain;
        a second doped region comprising at least one of an opposing source and an opposing drain;
        a body having a fin-like structure positioned between the first doped region and the second doped region and comprising:
            an undoped region; and
            a third doped region adjacent the second doped region and separated from the first doped region at least by the undoped region, the third doped region comprising a heavily doped region including nano-particles; and
        a gate structure wrapping around multiple surfaces of a portion of the body;
    a bit line connected to the first doped region; and a word line connected to the gate structure.

2. The memory cell of claim 1, wherein each of the first doped region and the second doped region comprise an N-type dopant and wherein the third doped region comprises an P-type dopant.

3. The memory cell of claim 2, wherein the third doped region is separate from the gate structure and further comprises at least one rare-earth element.

4. The memory cell of claim 1, wherein the body further comprises an inert doped region adjacent the first doped region and separated from the second doped region by the undoped region and the first doped region.

5. The memory cell of claim 1, wherein the gate structure comprises:
    an insulating material on the body and having a dielectric constant greater than that of silicon dioxide; and
    a conductive material over the insulating material.

6. The memory cell of claim 2, further comprising a silicide material over the second doped region.

7. The memory cell of claim 2, further comprising epitaxial material on each of the first doped region and the second doped region.

8. A semiconductor device, comprising:
    a plurality of word lines extending in a first direction;
    a plurality of bit lines extending in a second direction perpendicular to the first direction; and
    a memory array comprising a plurality of memory cells arranged in rows and columns, each memory cell of the plurality of memory cells coupled to a respective word line of the plurality of word lines and coupled to a respective bit line of the plurality of bit lines and comprising:
        a storage transistor at a surface of a substrate comprising:
            a first doped region comprising dopant of a first conductivity type;
            a second doped region comprising dopant of the first conductivity type;
            a body having a fin-like structure positioned between the first doped region and the second doped region and comprising:
                an undoped region; and
                a third doped region comprising dopant of a second conductivity type, the third doped region adjacent the second doped region and separated from the first doped region at least by the undoped region, the third doped region comprising a heavily doped region including nano-particles; and
            a gate structure wrapping around multiple surfaces of a portion of the body.

9. A memory cell, comprising:
a storage transistor at a surface of a substrate comprising:
    a first doped region comprising at least one of a source and a drain;
    a second doped region comprising at least one of an opposing source and an opposing drain;
    a body having a fin-like structure positioned between the first doped region and the second doped region and comprising:
        an undoped region; and
        a third doped region adjacent the second doped region and separated from the first doped region at least by the undoped region; and
    a gate structure wrapping around multiple surfaces of a portion of the body;
a bit line connected to the first doped region; and
a word line connected to the gate structure, wherein each of the first doped region and the second doped region comprise an N-type dopant and wherein the third doped region comprises an P-type dopant, and wherein the third doped region is separate from the gate structure and further comprises at least one rare-earth element.

\* \* \* \* \*